(12) United States Patent
Huang et al.

(10) Patent No.: US 11,605,565 B2
(45) Date of Patent: Mar. 14, 2023

(54) THREE DIMENSIONAL INTEGRATED CIRCUITS WITH STACKED TRANSISTORS

(71) Applicant: Intel Corporation, Santa Clara, CA (US)

(72) Inventors: Cheng-Ying Huang, Hillsboro, OR (US); Willy Rachmady, Beaverton, OR (US); Gilbert Dewey, Beaverton, OR (US); Aaron Lilak, Beaverton, OR (US); Kimin Jun, Portland, OR (US); Brennen Mueller, Portland, OR (US); Ehren Mannebach, Beaverton, OR (US); Anh Phan, Beaverton, OR (US); Patrick Morrow, Portland, OR (US); Hui Jae Yoo, Portland, OR (US); Jack T. Kavalieros, Portland, OR (US)

(73) Assignee: Intel Corporation, Santa Clara, CA (US)

(*) Notice: Subject to any disclaimer, the term of this patent is extended or adjusted under 35 U.S.C. 154(b) by 868 days.

(21) Appl. No.: 16/236,156

(22) Filed: Dec. 28, 2018

(65) Prior Publication Data

US 2020/0211905 A1    Jul. 2, 2020

(51) Int. Cl.
*H01L 21/8238* (2006.01)
*H01L 27/092* (2006.01)
*H01L 29/423* (2006.01)

(52) U.S. Cl.
CPC .... *H01L 21/823807* (2013.01); *H01L 27/092* (2013.01); *H01L 29/42356* (2013.01)

(58) Field of Classification Search
CPC ........... H01L 21/823807; H01L 27/092; H01L 29/42356; H01L 21/823842;

(Continued)

(56) References Cited

U.S. PATENT DOCUMENTS

2002/0037615 A1* 3/2002 Matsuo ........... H01L 21/823842
257/E21.434
2013/0258746 A1* 10/2013 Kurokawa .......... H01L 27/0688
365/72

(Continued)

FOREIGN PATENT DOCUMENTS

WO    WO 2017/111866    6/2017

OTHER PUBLICATIONS

Office Action from European Patent Application No. 19209555.2, dated Dec. 7, 2021, 10 pgs.

(Continued)

*Primary Examiner* — David Vu
(74) *Attorney, Agent, or Firm* — Schwabe, Williamson & Wyatt, P.C.

(57) ABSTRACT

Embodiments herein describe techniques for a semiconductor device including a first transistor stacked above and self-aligned with a second transistor, where a shadow of the first transistor substantially overlaps with the second transistor. The first transistor includes a first gate electrode, a first channel layer including a first channel material and separated from the first gate electrode by a first gate dielectric layer, and a first source electrode coupled to the first channel layer. The second transistor includes a second gate electrode, a second channel layer including a second channel material and separated from the second gate electrode by a second gate dielectric layer, and a second source electrode coupled to the second channel layer. The second source electrode is self-aligned with the first source electrode, and separated from the first source electrode by an isolation layer. Other embodiments may be described and/or claimed.

20 Claims, 15 Drawing Sheets

(58) Field of Classification Search
CPC ..... H01L 21/823871; H01L 21/823814; H01L 21/8221; H01L 27/0688; H01L 21/8238
See application file for complete search history.

(56) References Cited

U.S. PATENT DOCUMENTS

| | | |
|---|---|---|
| 2014/0070327 A1 | 3/2014 | Niimi |
| 2015/0137249 A1* | 5/2015 | Lin .................... H01L 27/0688 257/773 |
| 2016/0247887 A1 | 8/2016 | Jun et al. |
| 2017/0110375 A1 | 4/2017 | Bao et al. |
| 2018/0204932 A1 | 7/2018 | Mehandru et al. |
| 2018/0315838 A1 | 11/2018 | Morrow |

OTHER PUBLICATIONS

Search Report from European Patent Application No. 19209555.2, dated Jul. 3, 2020, 16 pgs.
Partial Search Report from European Patent Application No. 19209555.2, dated Apr. 29, 2020, 16 pgs.

* cited by examiner

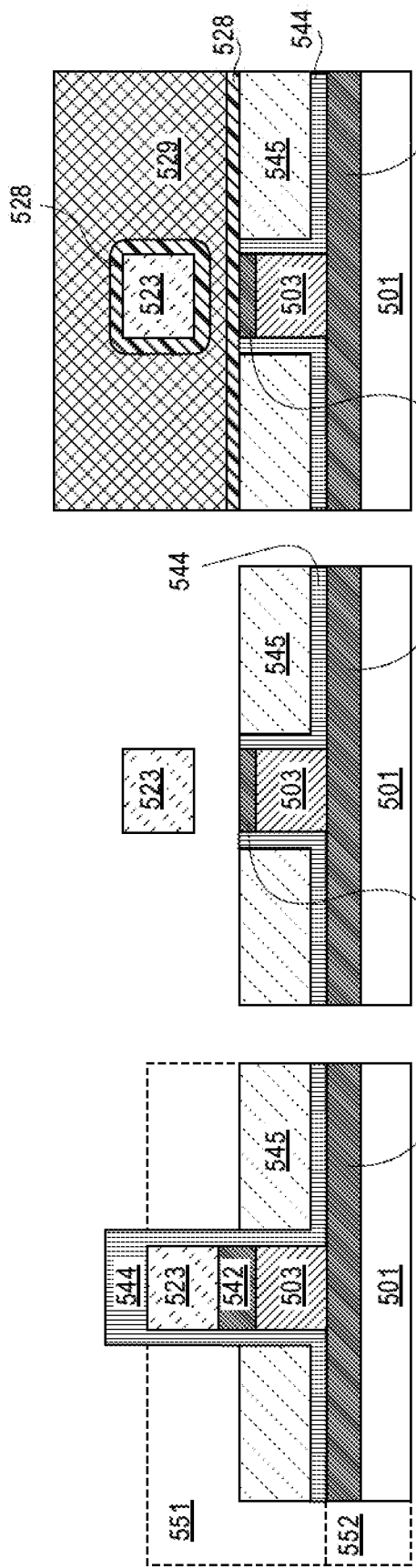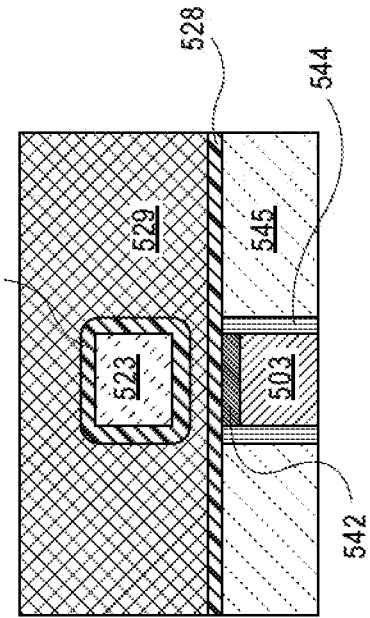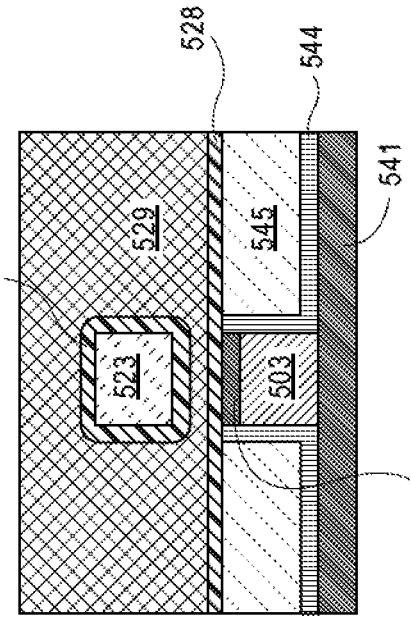
Figure 5(a)
Figure 5(b)
Figure 5(c)
Figure 5(d)
Figure 5(e)

THREE DIMENSIONAL INTEGRATED CIRCUITS WITH STACKED TRANSISTORS

FIELD

Embodiments of the present disclosure generally relate to the field of integrated circuits, and more particularly, to integrated circuits.

BACKGROUND

The transistor is the fundamental building block of integrated circuits (IC) and modern electronic devices, and is ubiquitous in modern electronic systems. A major driving force for IC technology is the ever increasing levels of circuit integration of more transistors, with improved performance and functionality, and reduced costs. Complementary metal-oxide-semiconductor (CMOS) is a technology for constructing integrated circuits with high noise immunity and low static power consumption based on symmetrical pair of n-type and p-type transistors. CMOS technology is used in microprocessors, microcontrollers, memory devices, and other digital logic circuits. Many technologies have been developed for higher level of circuit integration, e.g., wafer scale integration, system-on-a-chip (SOC), three-dimensional (3D) integration, and more. However, each technology has its own problems to be solved.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

FIGS. 5(a)-5(h) schematically illustrate a process for forming a semiconductor device having a first transistor stacked above a second transistor with a first gate electrode directly coupled to a second gate electrode, in accordance with some embodiments.

DETAILED DESCRIPTION

Figure 1A:
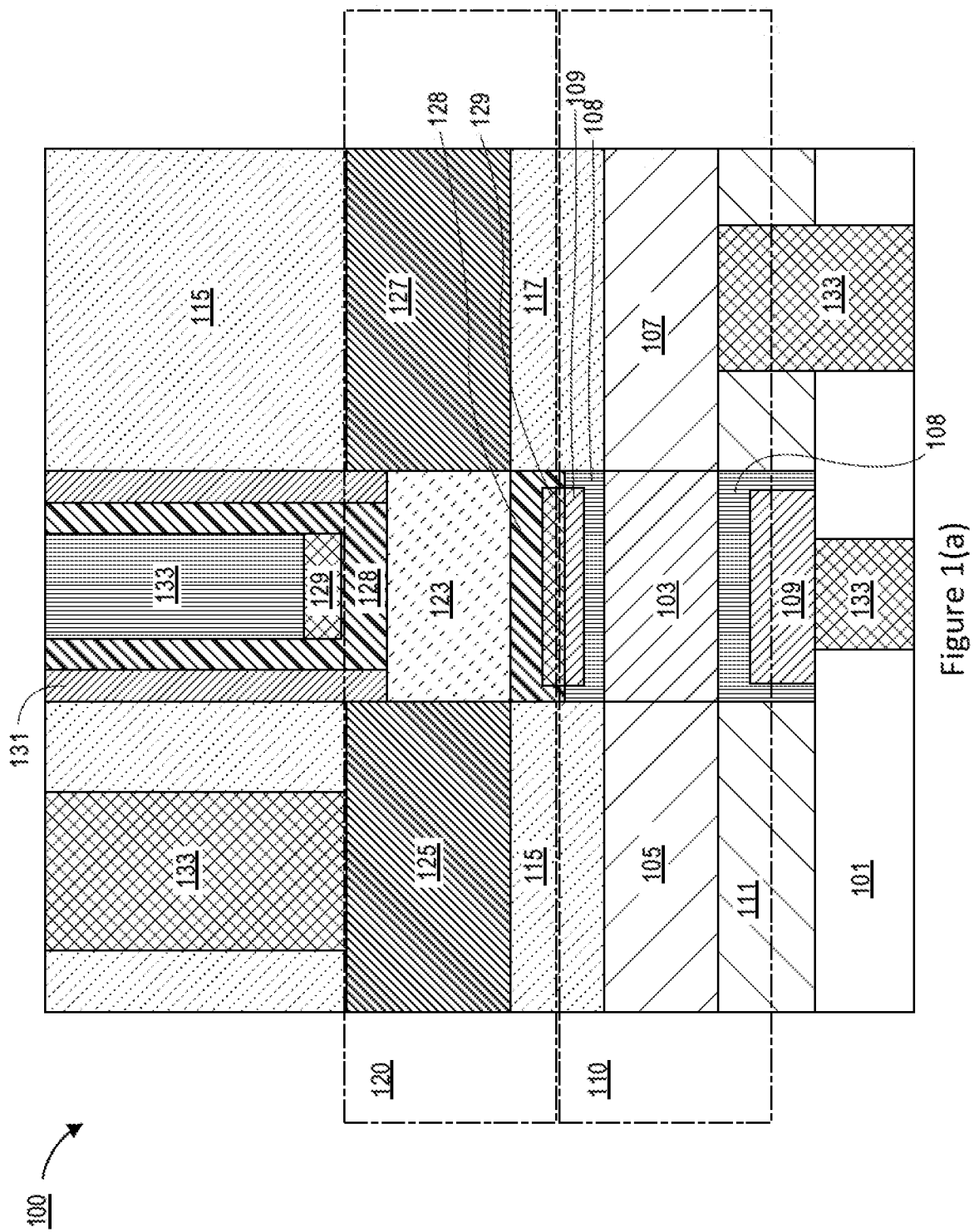
FIGS. 1(a)-1(c) schematically illustrate diagrams of a semiconductor device having a first transistor stacked above and self-aligned with a second transistor, in accordance with some embodiments.

Three dimensional (3D) stacked transistors provide a viable architecture for integrated circuits (IC) to increase transistor density, reduce cell sizes, and further extend Moore's law beyond generations of technologies. Complementary metal-oxide-semiconductor (CMOS) is a technology for constructing ICs based on symmetrical pair of NMOS and PMOS transistors, or n-type and p-type transistors. By stacking one transistor over another, 3D CMOS circuits enable smaller cell sizes as compared with conventional CMOS circuits. However, it has been a formidable challenge to implement 3D CMOS circuits with stacked transistors have different channel materials, e.g., non-silicon heterogeneous channel materials, different or dissimilar high-k materials at the gate stack of the stacked transistors, to enhance NMOS and PMOS performance at low supply voltages. Some methods to implement 3D CMOS circuits with stacked transistors having heterogeneous channel materials may process PMOS transistors and NMOS transistors separately in sequence. After transistors at a bottom layer, e.g., PMOS transistors, are fully processed and implemented, they can be bonded with the other channel materials to form transistors at a top layer, e.g., NMOS transistors. In order to form transistors at the top layer, a second round of front end process will be used to implement the transistors at the top layer. The interlayer interconnects are formed after transistors at both the top layer and the bottom layer are formed. Processing PMOS transistors and NMOS transistors separately in sequence offers large flexibility in implementing 3D CMOS circuits with stacked transistors having different channel materials. However, such a method may have considerable disadvantages, e.g., misalignment between the transistors at the bottom layer and the transistors at the top layer, and high cost caused by the second round of front end process to implement the transistors at the top layer.

Embodiments herein may present 3D CMOS circuits with stacked transistors, and methods and processes for forming 3D CMOS circuits with stacked transistors. In some embodiments, the stacked transistors have different channel materials, e.g., non-silicon heterogeneous channel materials, different or dissimilar high-k materials at the gate stack of the stacked transistors. A channel stack including a first channel layer and a second channel layer with a bonding layer in between may be formed over a carrier wafer, where the channel stack may be formed by wafer bonding process or epitaxial grown over the carrier wafer. Afterward, a transistor at a bottom layer including the first channel layer may be processed concurrently, not sequentially, with a transistor at a top layer including the second channel layer. Hence, the stacked transistors are formed simultaneously using the same patterning steps. As a result, the transistor at the top layer is automatically self-aligned to the transistor at the bottom layer, while the fabrication cost is reduced. In some embodiments, the transistor at the top layer may have a gate-to-gate connection with the transistor at the bottom layer, where a gate electrode of the transistor at the top layer is directly coupled to a gate electrode of the transistor at the bottom layer without any additional conductive contact. Hence, the fabrication of interconnects to couple one gate electrode to another gate electrode can be avoided while reducing the risk of degrading the performance of the stacked transistors.

Embodiments herein may present a semiconductor device. The semiconductor device includes a first transistor stacked above a second transistor, where the first transistor and the second transistor are self-aligned that a shadow of the first transistor substantially overlaps with the second transistor. The first transistor includes a first gate electrode, a first channel layer including a first channel material and separated from the first gate electrode by a first gate dielectric layer, and a first source electrode coupled to the first channel layer. The second transistor includes a second gate electrode, a second channel layer including a second channel material and separated from the second gate electrode by a second gate dielectric layer, and a second source electrode coupled to the second channel layer. The second source electrode is further self-aligned with the first source electrode, and separated from the first source electrode by an isolation layer. In embodiments, a source electrode and a drain electrode may be used interchangeably.

Embodiments herein may present a method for forming a semiconductor device. The method may include forming a channel stack above a carrier wafer. The carrier wafer includes a substrate and a first bonding layer above the substrate. The channel stack includes a first channel layer, a second bonding layer above the first channel layer, and a second channel layer above the second bonding layer. The first channel layer includes a first channel material, while the second channel layer includes a second channel material. The method includes patterning the channel stack simultaneously by a set of front end mask to form a first channel area of the first channel layer, and a second channel area of the second channel layer separated from the first channel area by the second bonding layer. In addition, the method includes forming a dummy oxide layer and a dummy gate layer covering the first channel area and the second channel area. Moreover, the method includes forming a first source electrode next to the first channel area, and forming a second source electrode next to the second channel area, where the second source electrode is self-aligned with the first source electrode, and separated from the first source electrode by an isolation layer. Similarly, the method includes forming a first drain electrode next to the first channel area, and forming a second drain electrode next to the second channel area, where the second drain electrode is self-aligned with the first drain electrode, and separated from the first drain electrode by an isolation layer. Furthermore, the method includes forming a first gate dielectric layer around the first channel area, and a second gate dielectric layer around the second channel area; and forming a first gate electrode around the first channel area, separated from the first channel area by the first gate dielectric layer, and forming a second gate electrode around the second channel area, separated from the second channel area by the second gate dielectric layer.

Embodiments herein may present a computing device, which may include a circuit board, and a processor or a memory device coupled to the circuit board. In more detail, the processor or the memory device includes an IC. The IC includes a first transistor stacked above a second transistor, where the first transistor and the second transistor are self-aligned that a shadow of the first transistor substantially overlaps with the second transistor. The first transistor includes a first gate electrode, a first channel layer including a first channel material and separated from the first gate electrode by a first gate dielectric layer, and a first source electrode coupled to the first channel layer. The second transistor includes a second gate electrode, a second channel layer including a second channel material and separated from the second gate electrode by a second gate dielectric layer, and a second source electrode coupled to the second channel layer. The second source electrode is further self-aligned with the first source electrode, and separated from the first source electrode by an isolation layer. In embodiments, a source electrode and a drain electrode may be used interchangeably.

In the following description, various aspects of the illustrative implementations will be described using terms commonly employed by those skilled in the art to convey the substance of their work to others skilled in the art. However, it will be apparent to those skilled in the art that the present disclosure may be practiced with only some of the described aspects. For purposes of explanation, specific numbers, materials and configurations are set forth in order to provide a thorough understanding of the illustrative implementations. However, it will be apparent to one skilled in the art that the present disclosure may be practiced without the specific details. In other instances, well-known features are omitted or simplified in order not to obscure the illustrative implementations.

Front-end-of-line (FEOL), or simply front end, semiconductor processing and structures may refer to a first portion of integrated circuit (IC) fabrication where individual devices (e.g., transistors, capacitors, resistors, etc.) are patterned in a semiconductor substrate or layer. FEOL generally covers everything up to (but not including) the deposition of metal interconnect layers. A transistor formed in FEOL may also be referred to as a front end transistor. Following the last FEOL operation, the result is typically a wafer with isolated transistors (e.g., without any wires). Back end of line (BEOL), or simply back end, semiconductor processing and structures may refer to a second portion of IC fabrication where the individual devices (e.g., transistors, capacitors, resistors, etc.) are interconnected with wiring on the wafer, e.g., the metallization layer or layers. BEOL includes metal contacts, dielectrics layers, metal levels, and bonding sites for chip-to-package connections. In the BEOL part of the fabrication, metal contacts, pads, interconnect wires, vias, and dielectric structures may be formed. For modern IC processes, more than 10 metal layers may be added in the BEOL. A thin-film transistor (TFT) is a kind of field-effect transistor formed at BEOL and including a channel layer, a gate electrode, and source and drain electrodes, over a supporting but non-conducting substrate.

Various operations will be described as multiple discrete operations, in turn, in a manner that is most helpful in understanding the present disclosure. However, the order of description should not be construed to imply that these operations are necessarily order dependent. In particular, these operations may not be performed in the order of presentation. For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The terms "over," "under," "between," "above," and "on" as used herein may refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

Where the disclosure recites "a" or "a first" element or the equivalent thereof, such disclosure includes one or more such elements, neither requiring nor excluding two or more such elements. Further, ordinal indicators (e.g., first, second, or third) for identified elements are used to distinguish between the elements, and do not indicate or imply a required or limited number of such elements, nor do they indicate a particular position or order of such elements unless otherwise specifically stated.

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

Implementations of the disclosure may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present disclosure.

A plurality of transistors, such as metal-oxide-semiconductor field-effect transistors (MOSFET or simply MOS transistors), may be fabricated on the substrate. In various implementations of the disclosure, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the disclosure may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type work function metal or N-type work function metal, depending on whether the transistor is to be a PMOS or an NMOS transistor. In some implementations, the gate electrode layer may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a work function that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a work function that is between about 3.9 eV and about 4.2 eV.

In some implementations, when viewed as a cross-section of the transistor along the source-channel-drain direction, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

In some implementations of the disclosure, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process operations. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 1B:
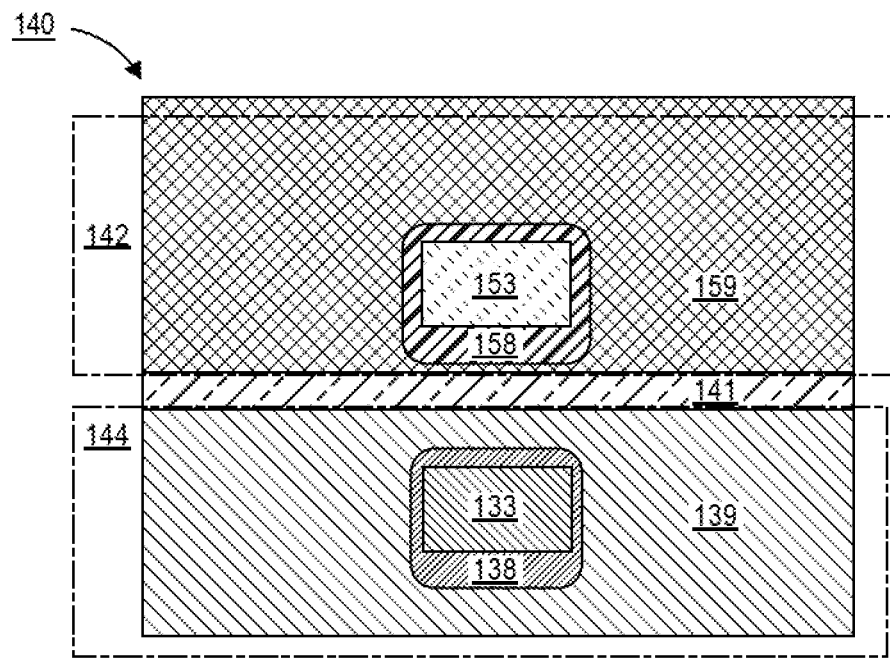
Figure 1C:
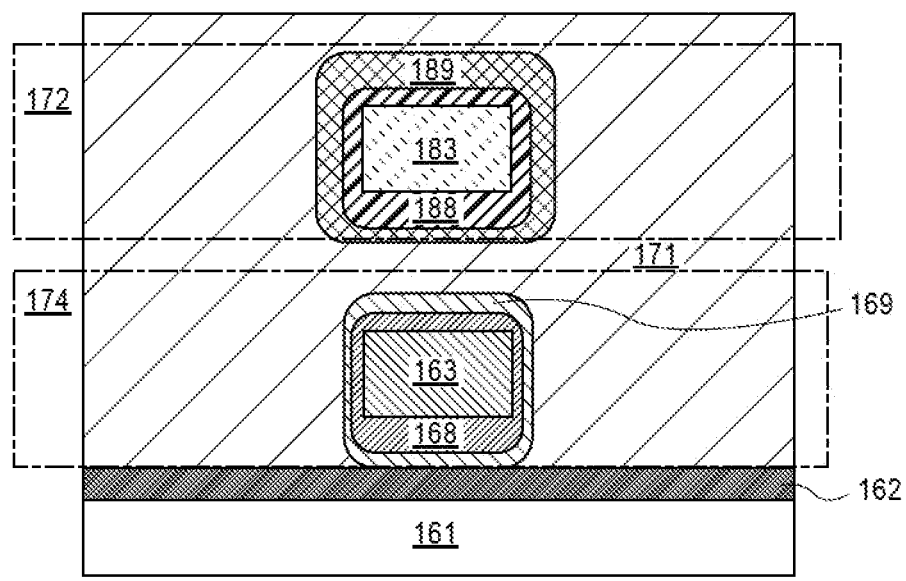

FIGS. 1(a)-1(c) schematically illustrate diagrams of a semiconductor device having a first transistor stacked above and self-aligned with a second transistor, in accordance with some embodiments. For example, a semiconductor device 100 has a first transistor 120 stacked above and self-aligned with a second transistor 110 as shown in FIG. 1(a), a semiconductor device 140 has a first transistor 142 stacked above and self-aligned with a second transistor 144 as shown in FIG. 1(b), a semiconductor device 170 has a first transistor 172 stacked above and self-aligned with a second transistor 174 as shown in FIG. 1(c). For clarity, features of the semiconductor device 100, the semiconductor device 140, the semiconductor device 170, the first transistor 120, the second transistor 110, the first transistor 142, the second transistor 144, the first transistor 172, and the second transistor 174, may be described below as examples for understanding an example semiconductor device having a first transistor stacked above and self-aligned with a second transistor. It is to be understood that there may be more or fewer components within the semiconductor device 100, the semiconductor device 140, the semiconductor device 170, the first transistor 120, the second transistor 110, the first transistor 142, the second transistor 144, the first transistor 172, and the second transistor 174. Further, it is to be understood that one or more of the components within a semiconductor device having a first transistor stacked above and self-aligned with a second transistor, may include additional and/or varying features from the description below, and may include any device that one having ordinary skill in the art would consider and/or refer to as a semiconductor device having a first transistor stacked above and self-aligned with a second transistor.

In embodiments, as shown in FIG. 1(a), the semiconductor device 100 includes the first transistor 120 stacked above and self-aligned with the second transistor 110, both above a substrate 101. The first transistor 120 may be an NMOS transistor, and the second transistor 110 may be a PMOS transistor. In some other embodiments, the first transistor 120 may be a PMOS transistor, and the second transistor 110 may be an NMOS transistor. There may be embodiments where both the first transistor 120 and the second transistor 110 are a PMOS transistor or an NMOS transistor. The substrate 101 may be an III-V substrate, a silicon substrate, a bulk substrate, or a glass substrate. The first transistor 120 may be located at a front side of a wafer, and the second transistor 110 may be located at a backside of the wafer.

In embodiments, the first transistor 120 includes a first gate electrode 129, a first channel layer 123 separated from the first gate electrode 129 by a first gate dielectric layer 128, a first source electrode 125 and a first drain electrode 127 coupled to the first channel layer 123, and a spacer 131 between the first source electrode 125 and the first gate electrode 129, or between the first drain electrode 127 and the first gate electrode 129. The second transistor 110 includes a second gate electrode 109, a second channel layer 103 separated from the second gate electrode 109 by a second gate dielectric layer 108, a second source electrode 105 and a second drain electrode 107 coupled to the second channel layer 103. There may be a spacer between the second source electrode 105 and the second gate electrode 109, or between the second drain electrode 107 and the second gate electrode 109, not shown. The second source electrode 105 is separated from the first source electrode 125 by an isolation layer 115, and the second drain electrode 107 is separated from the first drain electrode 127 by an isolation layer 117. There may be an isolation layer 111 above the substrate 101 and below the second channel layer 103. In addition, there may be one or more contacts 133 coupled to the first gate electrode 129, the first source electrode 125, the first drain electrode 127, the second gate electrode 109, the second source electrode 105, or the second drain electrode 107.

In embodiments, the first transistor 120 is self-aligned with the second transistor 110 that a shadow of the first transistor 120 substantially overlaps with the second transistor 110. In addition, the first source electrode 125 is self-aligned with the second source electrode 105, the first drain electrode 127 is self-aligned with the second drain electrode 107, and the first gate electrode 129 is self-aligned with the second gate electrode 109. In embodiments, the first transistor 120 and the second transistor 110 may be made concurrently following a same set of front end mask, leading to the result that the source electrodes, the drain electrodes, and the gate electrodes of the first transistor 120 and the second transistor 110 are all self-aligned.

In embodiments, the first gate electrode 129 is directly coupled to the second gate electrode 109 without any additional conductive contact, forming a gate-to-gate connection. The fabrication of gate-to-gate connection, such as the connection of the first gate electrode 129 and the second gate electrode 109 can avoid or reduce degrading the performance of the stacked transistors caused by forming an interconnect between the first gate electrode 129 and the second gate electrode 109. The first gate electrode 129 may include a first conductive material, and the second gate electrode 109 may include a second conductive material different from the first conductive material.

In embodiments, the first channel layer 123 includes a first channel material, and the second channel layer 103 includes a second channel material. The first channel material or the second channel material may include silicon (Si), germanium(Ge), silicon-germanium(SiGe), gallium arsenide (GaAs), a III-V material, an III-N material, indium gallium arsenide(InGaAs), indium phosphide(InP), a 2-D material, an oxide semiconductor material, or gallium nitride(GaN). In some embodiments, the first channel material may be different from the second channel material. Furthermore, the first channel layer 123 may include one or more fins, one or more nanowires, or one or more nanoribbons, and the second channel layer 103 may include one or more fins, one or more nanowires, or one or more nanoribbons. In some embodiments, the first channel layer 123 includes a first channel area, the second channel layer 103 includes a second channel area with a shape different from a shape of the first channel area. For example, the first channel layer 123 may include one or more fins, while the second channel layer 103 may include one or more nanowires or one or more nanoribbons. Similarly, the first channel layer 123 may include one or more nanowires, while the second channel layer 103 may include one or more fins, or one or more nanoribbons.

In embodiments, the first gate dielectric layer 128 may include a first gate dielectric material, and the second gate dielectric layer 108 may include a second gate dielectric material different from the first gate dielectric material. For example, the first gate dielectric layer 128 or the second gate dielectric layer 108 may include a high-k dielectric material selected from the group consisting of hafnium silicate, zirconium silicate, hafnium dioxide, zirconium dioxide, aluminum oxide, HfAlOx, lanthanum silicate, yttrium oxide, and nitride hafnium silicate.

In embodiments, the first gate electrode 129, the first source electrode 125, the first drain electrode 127, the second gate electrode 109, the second source electrode 105, or the second drain electrode 107, may include a material selected from the group consisting of titanium (Ti), molybdenum (Mo), gold (Au), platinum (Pt), aluminum (Al), nickel (Ni), copper (Cu), chromium (Cr), hafnium (Hf), indium (In), and an alloy of Ti, Mo, Au, Pt, Al, Ni, Cu, Cr, TiAlN, HfAlN, TiN, Co, Ru, W, silicide, or InAlO. In some other embodiments, the first gate electrode 129, the first source electrode 125, the first drain electrode 127, the second gate electrode 109, the second source electrode 105, or the second drain electrode 107, may be a stack including multiple layers, and may include a metal layer, and a metal sealant layer adjacent to the metal layer.

In embodiments, as shown in FIG. 1(b), the semiconductor device 140 includes the first transistor 142 stacked above and self-aligned with the second transistor 144. The first transistor 142 may be located at a front side of a wafer, and the second transistor 144 may be located at a backside of the wafer, with a substrate of the wafer removed.

The first transistor 142 includes a first gate electrode 159, a first channel layer 153 separated from the first gate electrode 159 by a first gate dielectric layer 158. Other components of the first transistor 142, e.g., a source electrode, a drain electrode, not shown. The second transistor 144 includes a second gate electrode 139, a second channel layer 133 separated from the second gate electrode 139 by a second gate dielectric layer 138. An isolation layer 141 is between the first gate electrode 159 and the second gate electrode 139.

As shown in FIG. 1(c), the semiconductor device 170 includes the first transistor 172 stacked above and self-aligned with the second transistor 174, both above a substrate 161, and a bonding layer 162 above the substrate 161 and below and adjacent to the second transistor 174.

The first transistor 172 includes a first gate electrode 189, a first channel layer 183 separated from the first gate electrode 189 by a first gate dielectric layer 188. Other components of the first transistor 172, e.g., a source electrode, a drain electrode, not shown. The second transistor 174 includes a second gate electrode 169, a second channel layer 163 separated from the second gate electrode 169 by a second gate dielectric layer 168. The first gate electrode 189 and the second gate electrode 169 are surrounded by one metal electrode 171.

Figure 2:
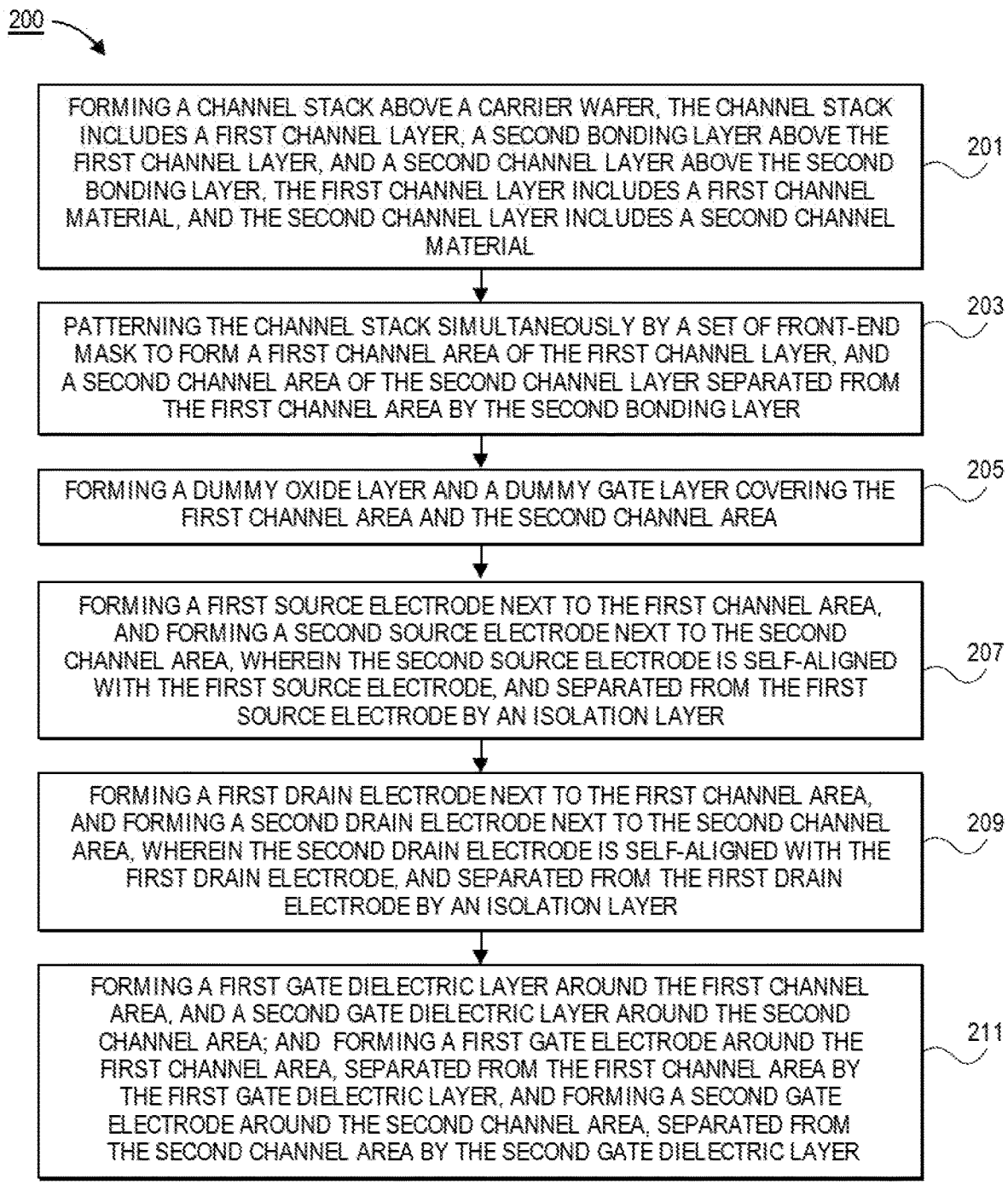
FIG. 2 schematically illustrates a process for forming a semiconductor device having a first transistor stacked above and self-aligned with a second transistor, in accordance with some embodiments.

FIG. 2 schematically illustrates a process 200 for forming a semiconductor device having a first transistor stacked above and self-aligned with a second transistor, in accordance with some embodiments. More details of the process 200 are illustrated in FIGS. 3(a)-3(g). In embodiments, the process 200 may be applied to form the semiconductor device 100, the semiconductor device 140, or the semiconductor device 170, having a first transistor stacked above and self-aligned with a second transistor, as shown in FIGS. 1(a)-1(c).

Figure 3A:
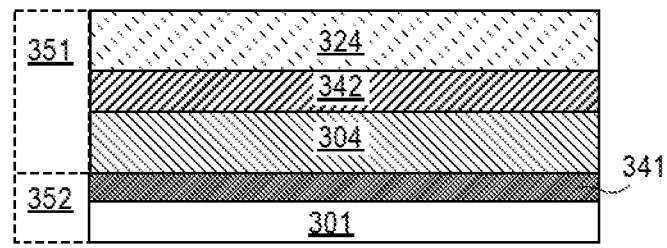
FIGS. 3(a)-3(g) schematically illustrate a process for forming a semiconductor device having a first transistor stacked above and self-aligned with a second transistor, in accordance with some embodiments.

At block 201, the process 200 may include forming a channel stack above a carrier wafer, wherein the carrier wafer includes a substrate and a first bonding layer above the substrate, the channel stack includes a first channel layer, a second bonding layer above the first channel layer, and a second channel layer above the second bonding layer, the first channel layer includes a first channel material, and the second channel layer includes a second channel material. More details are shown in FIG. 3(a). A channel stack 351 is formed above a carrier wafer 352. The carrier wafer 352 includes a substrate 301 and a first bonding layer 341 above the substrate 301. The channel stack 351 includes a first channel layer 304, a second bonding layer 342 above the first channel layer 304, and a second channel layer 324 above the second bonding layer 342. The first channel layer 304 includes a first channel material, and the second channel layer 324 includes a second channel material.

Figure 3B:
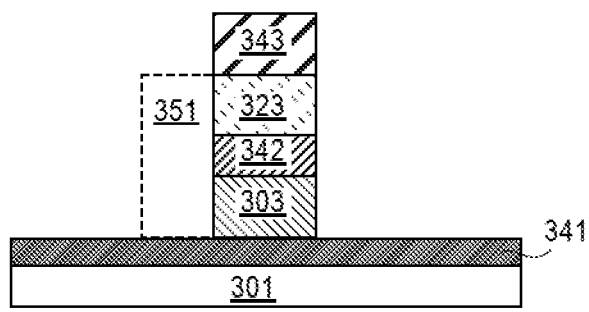

At block 203, the process 200 may include patterning the channel stack simultaneously by a set of front end mask to form a first channel area of the first channel layer, and a second channel area of the second channel layer separated from the first channel area by the second bonding layer. More details are shown in FIG. 3(b). The channel stack 351 is simultaneously patterned by a set of front end mask 343 to form a first channel area 303 of the first channel layer 304, and a second channel area 323 of the second channel layer 324 separated from the first channel area 303 by the second bonding layer 342.

Figure 3C:
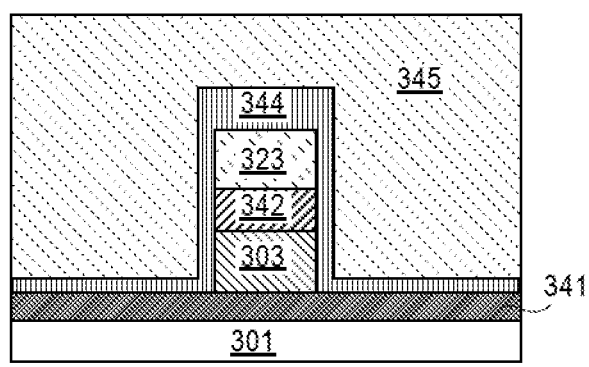
Figure 3D:
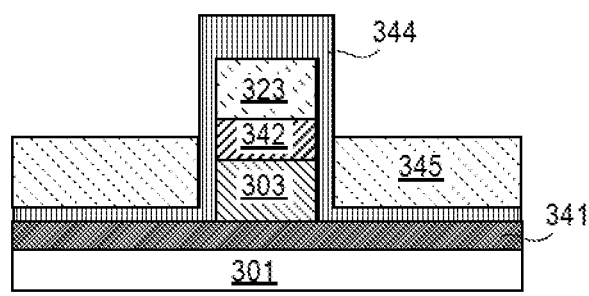

At block 205, the process 200 may include forming a dummy oxide layer and a dummy gate layer covering the first channel area and the second channel area. More details are shown in FIG. 3(c) and FIG. 3(d). A dummy oxide layer 344 and a dummy gate layer 345 are formed to cover the first channel area 303 and the second channel area 323 as shown in FIG. 3(c). Part of the dummy gate layer 345 may be removed in FIG. 3(d).

Figure 3E:
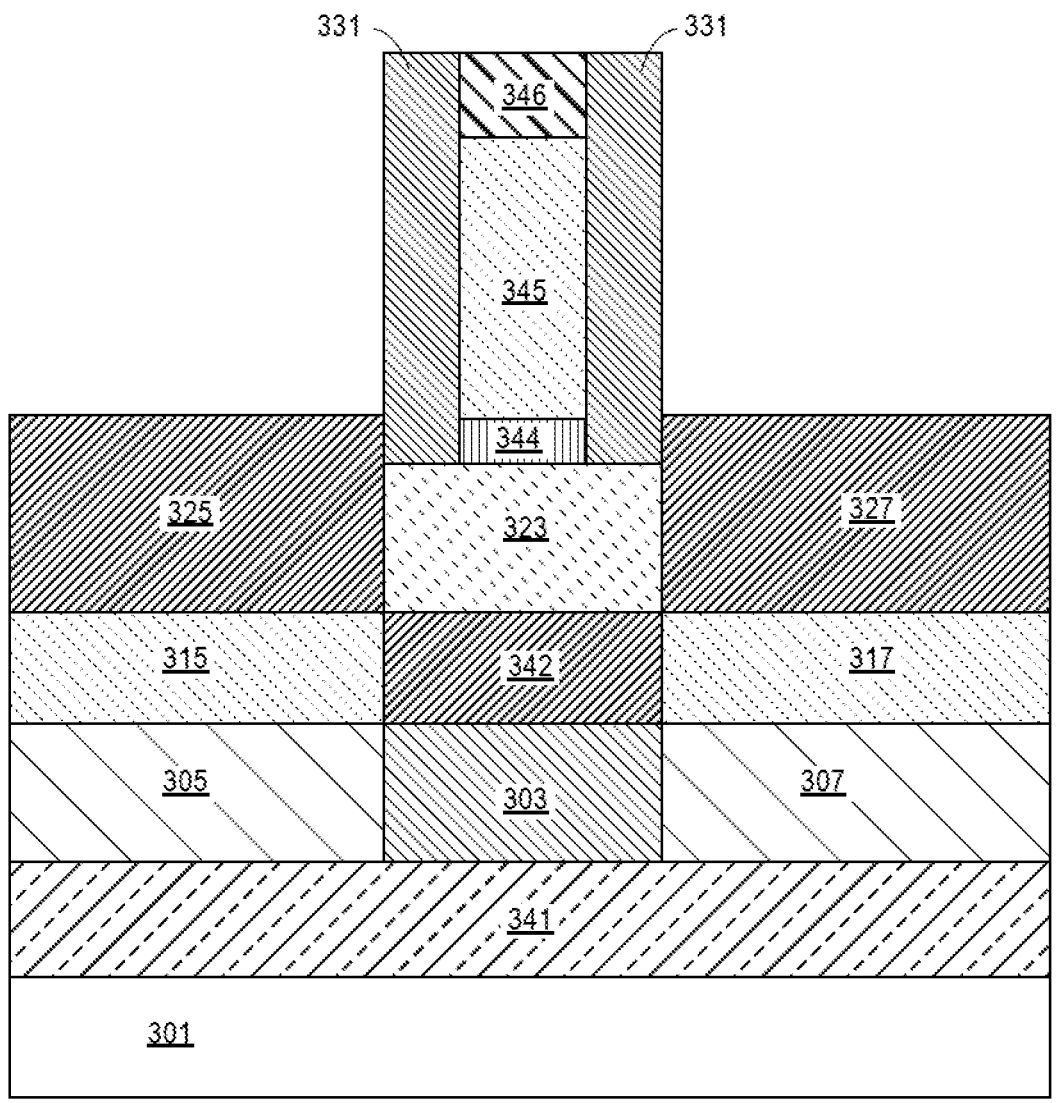

At block 207, the process 200 may include forming a first source electrode next to the first channel area, and forming a second source electrode next to the second channel area, wherein the second source electrode is self-aligned with the first source electrode, and separated from the first source electrode by an isolation layer. More details are shown in FIG. 3(e). A first source electrode 305 is formed next to the first channel area 303, and a second source electrode 325 is formed next to the second channel area 323. The second source electrode 325 is self-aligned with the first source electrode 305, and separated from the first source electrode 305 by an isolation layer 315.

At block 209, the process 200 may include forming a first drain electrode next to the first channel area, and forming a second drain electrode next to the second channel area, wherein the second drain electrode is self-aligned with the first drain electrode, and separated from the first drain electrode by an isolation layer. More details are shown in FIG. 3(e). A first drain electrode 307 is formed next to the first channel area 303, and a second drain electrode 327 is formed next to the second channel area 323. The second drain electrode 327 is self-aligned with the first drain electrode 307, and separated from the first drain electrode 307 by an isolation layer 317. In some embodiments, a spacer 331 may be formed by a mask 346 placed above the dummy oxide layer 344 and the dummy gate layer 345. The spacer 331 is to separate the dummy gate layer 345 from the source electrodes and drain electrodes.

Figure 3F:
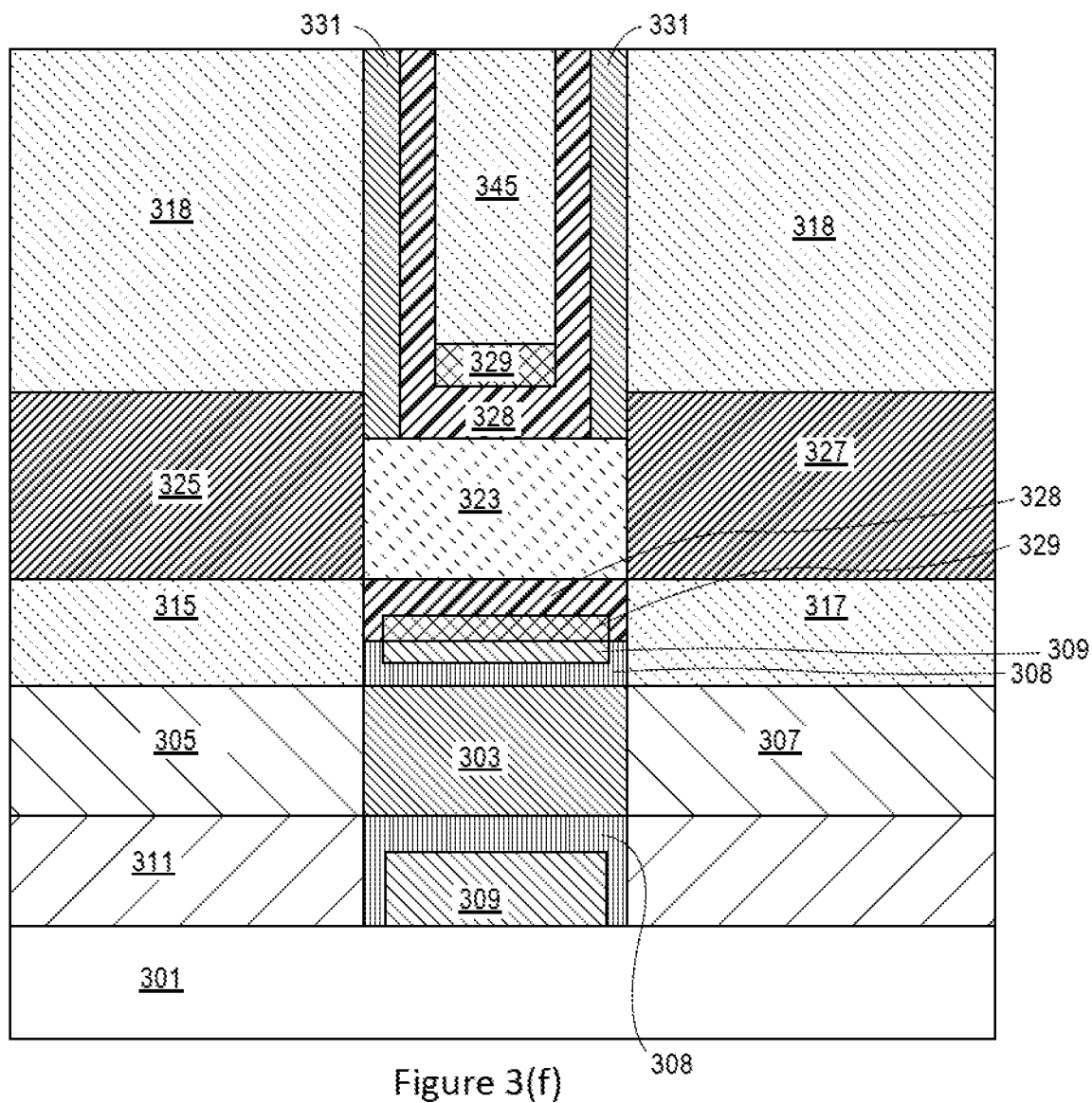

At block 211, the process 200 may include forming a first gate dielectric layer around the first channel area, and a second gate dielectric layer around the second channel area; and forming a first gate electrode around the first channel area, separated from the first channel area by the first gate dielectric layer, and forming a second gate electrode around the second channel area, separated from the second channel area by the second gate dielectric layer. More details are shown in FIG. 3(f). A first gate dielectric layer 308 is formed around the first channel area 303, and a second gate dielectric layer 328 is formed around the second channel area 323, at the space occupied by the first bonding layer 341 and the second bonding layer 342. A first gate electrode 309 is formed around the first channel area 303, separated from the first channel area 303 by the first gate dielectric layer 308. A second gate electrode 329 is formed around the second channel area 323, separated from the second channel area 323 by the second gate dielectric layer 328. An ILD layer 311 may be formed at some space occupied by the first bonding layer 341.

Figure 3G:
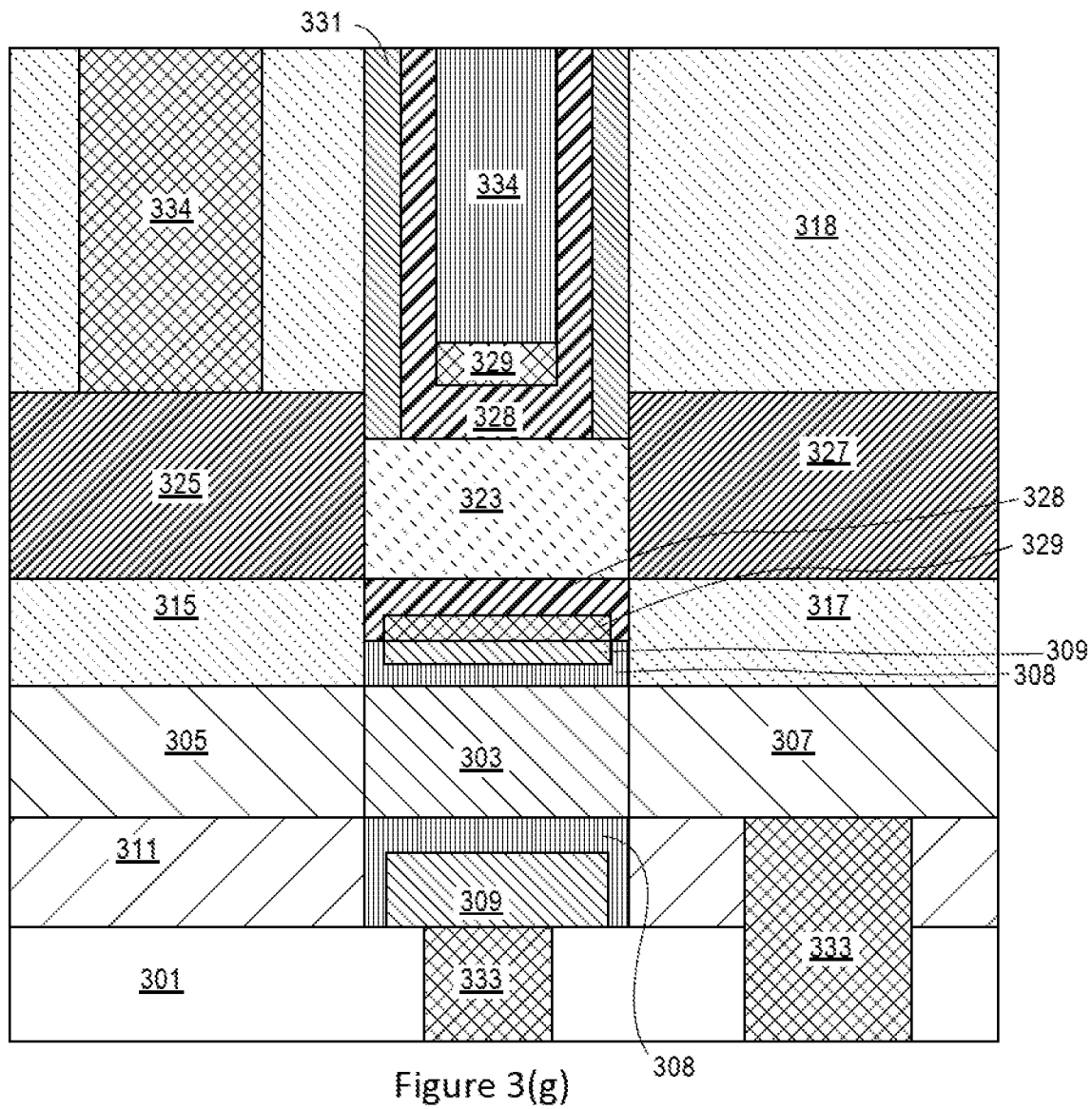

In addition, the process 200 may include additional operations to form other layers. For example, the process 200 may include forming a first contact coupled to the first gate electrode, the first source electrode, or the first drain electrode, or forming a second contact coupled to the second gate electrode, the second source electrode, or the second drain electrode, wherein the first contact is within an interconnect at a front side of the substrate, and the second contact is within an interconnect at a backside of the substrate. More details are shown in FIG. 3(g). A first contact 333 may be formed and coupled to the first gate electrode 309, the first source electrode 305, or the first drain electrode 307. A second contact 334 may be formed and coupled to the second gate electrode 329, the second source electrode 325, or the second drain electrode 327. The first contact 333 is within an interconnect at a backside of the substrate, which may include an ILD layer 311. The second contact 334 is within an interconnect at a front side of the substrate, which may include an ILD layer 318.

Figure 4:
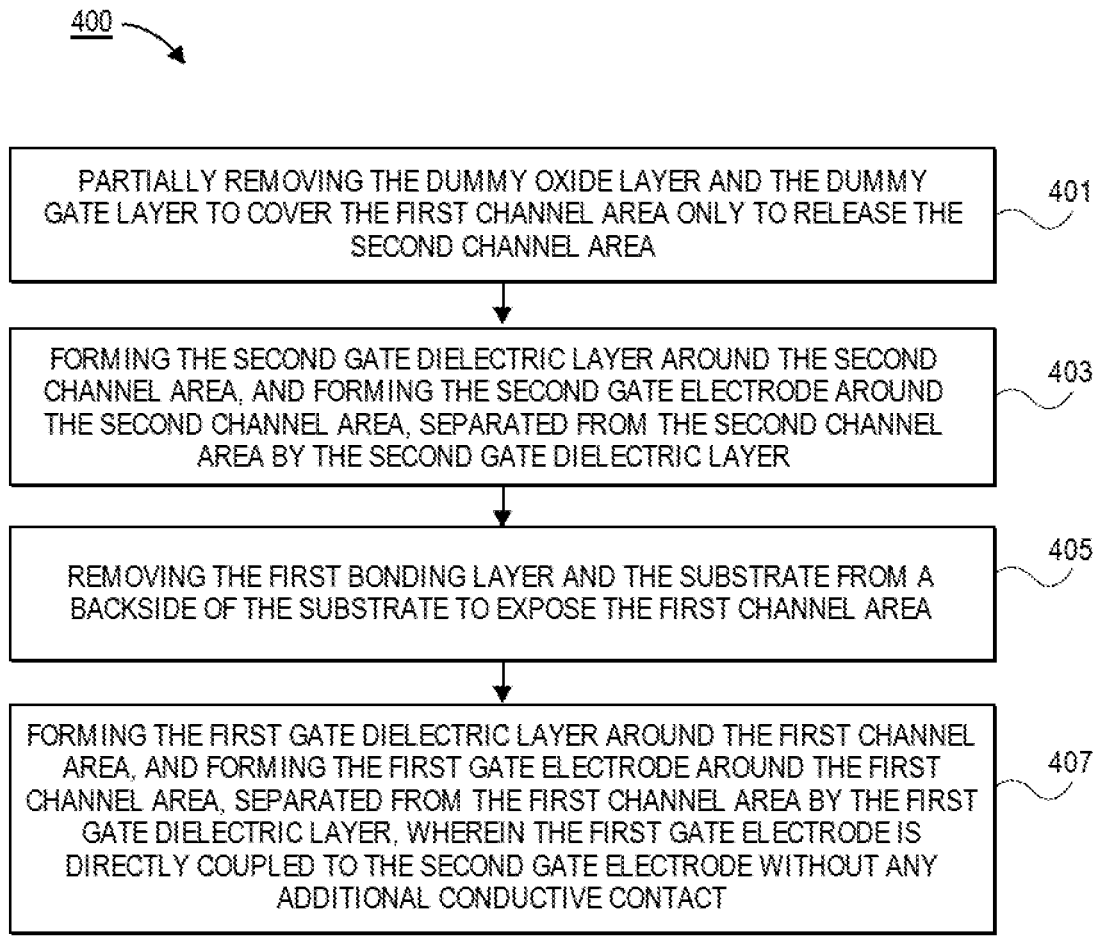
FIG. 4 schematically illustrates a process for forming a semiconductor device having a first transistor stacked above a second transistor with a first gate electrode directly coupled to a second gate electrode, in accordance with some embodiments.

FIG. 4 schematically illustrates a process 400 for forming a semiconductor device having a first transistor stacked above a second transistor with a first gate electrode directly coupled to a second gate electrode, in accordance with some embodiments. More details of the process 400 are illustrated in FIGS. 5(a)-5(h). The process 400 may be a refinement of the process 200, built upon some steps or operations of the process 200. For example, operations of block 401 of the process 400 may be performed after operations of block 205 have been performed to form the dummy oxide layer and the dummy gate layer covering the first channel area and the second channel area.

At block 401, the process 400 may include partially removing the dummy oxide layer and the dummy gate layer to cover the first channel area only to release the second channel area. More details are shown in FIGS. 5(a)-5(b). As shown in FIG. 5(a), a channel stack 551 is above a carrier wafer 552, similar to the device shown in FIG. 3(d). The carrier wafer 552 includes a substrate 501 and a first bonding layer 541. The channel stack 551 includes a first channel area 503, and a second channel area 523 separated from the first channel area 503 by a second bonding layer 542. A dummy oxide layer 544 and a dummy gate layer 545 are formed to cover the first channel area 503 and the second channel area 523. The dummy oxide layer 544 and the dummy gate layer 545 may be partially removed to cover the first channel area 503 only to release the second channel area 523.

At block 403, the process 400 may include forming the second gate dielectric layer around the second channel area, and forming the second gate electrode around the second channel area, separated from the second channel area by the second gate dielectric layer. More details are shown in FIG. 5(c). The second gate dielectric layer 528 may be formed around the second channel area 523, and the second gate electrode 529 may be formed around the second channel area 523, separated from the second channel area 523 by the second gate dielectric layer 528. In addition, the second gate dielectric layer 528 may cover a surface of the dummy gate layer 545, the second bonding layer 542, and the dummy oxide layer 544.

Figure 5F:
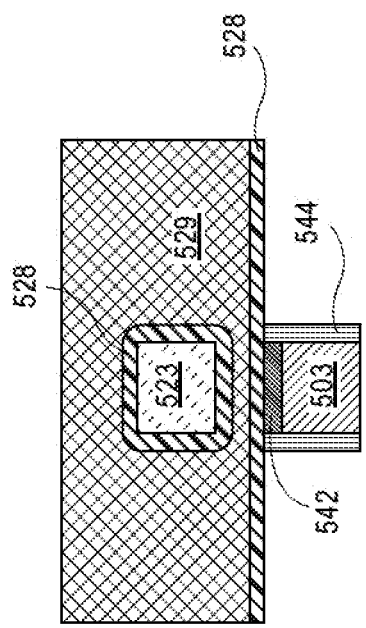
Figure 5G:
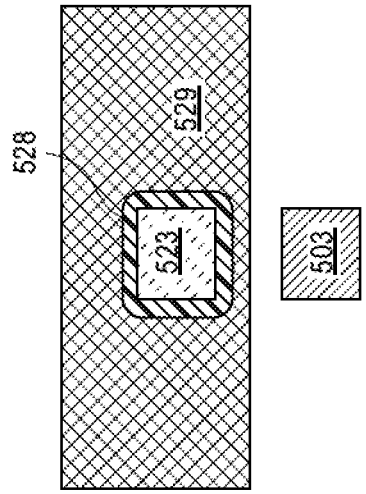

At block 405, the process 400 may include removing the first bonding layer and the substrate to expose the first channel area. More details are shown in FIGS. 5(d)-5(g). As shown in FIG. 5(d), the substrate 501 is removed from the backside. As shown in FIG. 5(e), the first bonding layer 541 is removed. As shown in FIG. 5(f), the dummy gate layer 545 is removed. As shown in FIG. 5(g), the second bonding layer 542 and the dummy oxide layer 544 are removed to expose the first channel area 503.

Figure 5H:
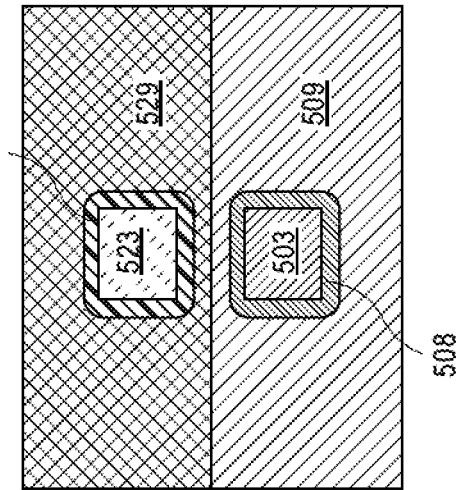

At block 407, the process 400 may include forming the first gate dielectric layer around the first channel area, and forming the first gate electrode around the first channel area, separated from the first channel area by the first gate dielectric layer, wherein the first gate electrode is directly coupled to the second gate electrode without any additional conductive contact. More details are shown in FIG. 5(h). The first gate dielectric layer 508 is formed around the first channel area 503, and the first gate electrode 509 is formed around the first channel area 503, separated from the first channel area 503 by the first gate dielectric layer 508. The first gate electrode 509 is directly coupled to the second gate electrode 529 without any additional conductive contact.

Figure 6:
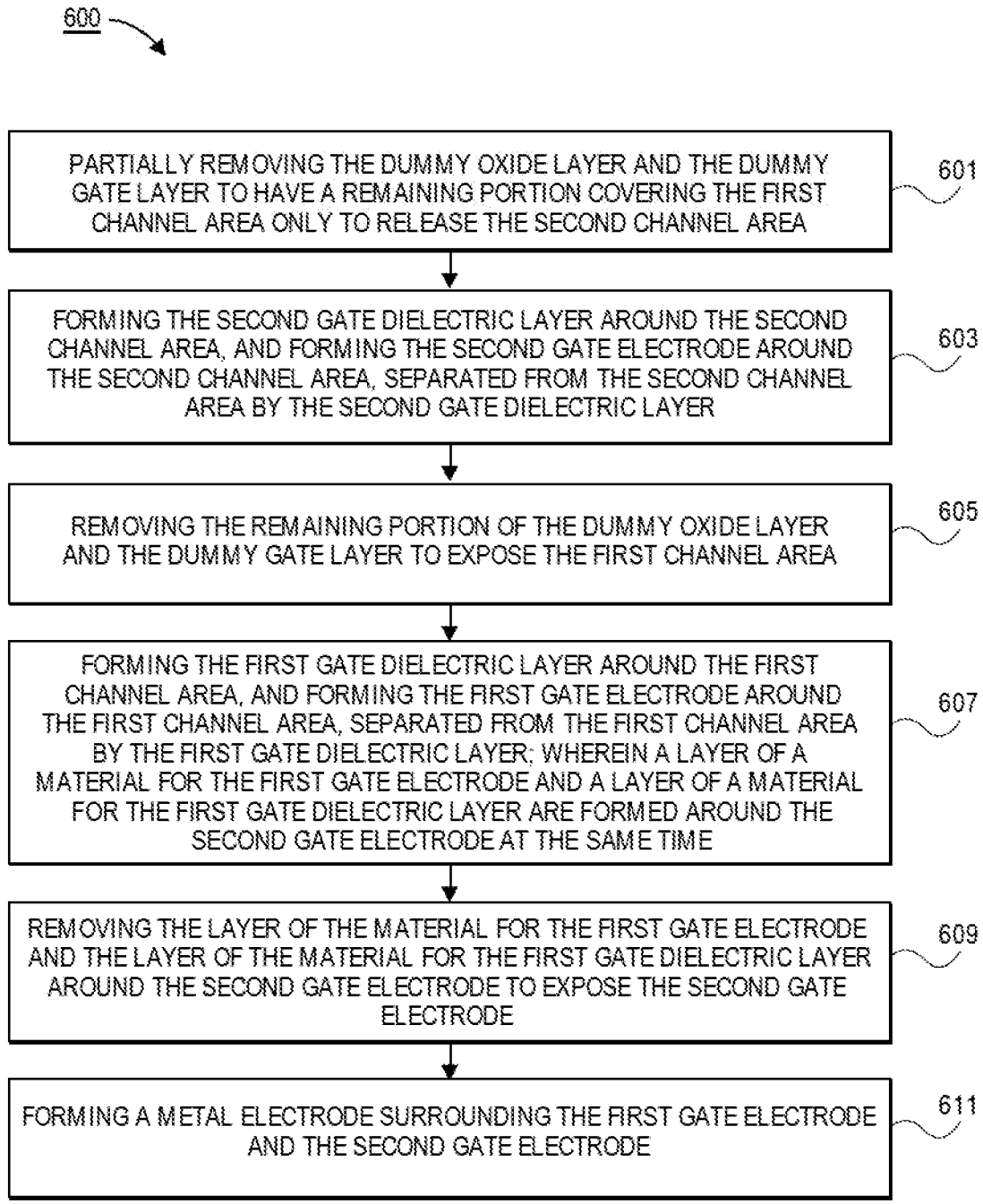
FIG. 6 schematically illustrates a process for forming a semiconductor device having a first transistor stacked above a second transistor with a first gate electrode coupled to a second gate electrode by a metal electrode, in accordance with some embodiments.

FIG. 6 schematically illustrates a process 600 for forming a semiconductor device having a first transistor stacked above a second transistor with a first gate electrode coupled to a second gate electrode by a metal electrode, in accordance with some embodiments. More details of the process 600 are illustrated in FIGS. 7(a)-7(g). Similar to the process 400, the process 600 may be a refinement of the process 200, built upon some steps or operations of the process 200. For example, operations of block 601 of the process 600 may be performed after operations of block 205 have been performed to form the dummy oxide layer and the dummy gate layer covering the first channel area and the second channel area. The process 600 may be an alternative to the process 400.

Figure 7A:
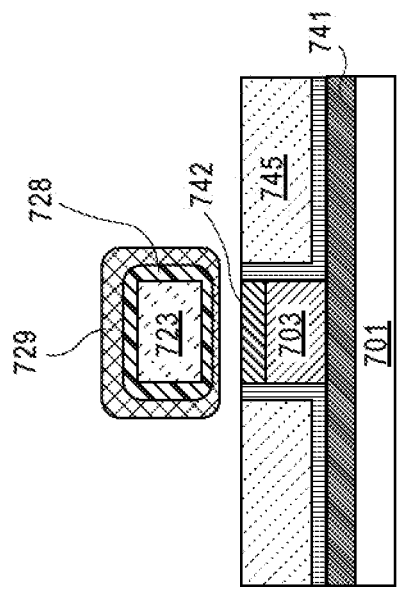
FIGS. 7(a)-7(g) schematically illustrate a process for forming a semiconductor device having a first transistor stacked above a second transistor with a first gate electrode coupled to a second gate electrode by a metal electrode, in accordance with some embodiments.

At block 601, the process 600 may include partially removing the dummy oxide layer and the dummy gate layer to have a remaining portion covering the first channel area only to release the second channel area. As shown in FIG. 7(a), a channel stack 751 is above a carrier wafer 752, similar to the device shown in FIG. 3(d). The carrier wafer 752 includes a substrate 701 and a first bonding layer 741. The channel stack 751 includes a first channel area 703, and a second channel area 723 separated from the first channel area 703 by a second bonding layer 742. A dummy oxide layer 744 and a dummy gate layer 745 are formed to cover the first channel area 703 and the second channel area 723. The dummy oxide layer 744 and the dummy gate layer 745 may be partially removed to have a remaining portion covering the first channel area 703 only to release the second channel area 723.

Figure 7B:
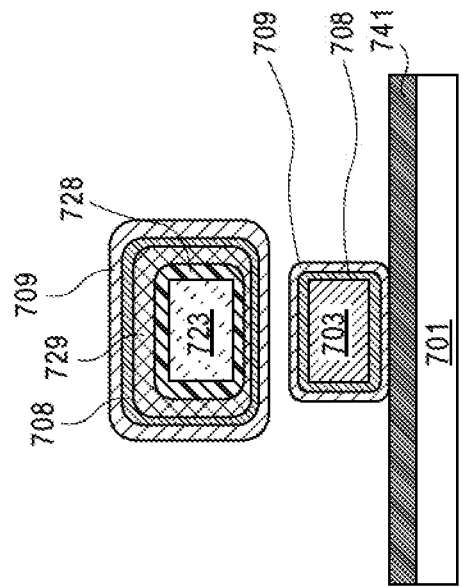

At block 603, the process 600 may include forming the second gate dielectric layer around the second channel area, and forming the second gate electrode around the second channel area, separated from the second channel area by the second gate dielectric layer. More details are shown in FIG. 7(b). The second gate dielectric layer 728 is formed around the second channel area 723, and the second gate electrode 729 is formed around the second channel area 723, separated from the second channel area 723 by the second gate dielectric layer 728.

Figure 7C:
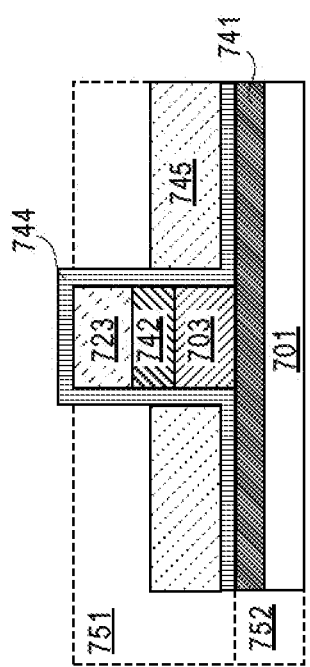

At block 605, the process 600 may include removing the remaining portion of the dummy oxide layer and the dummy gate layer to expose the first channel area. More details are shown in FIG. 7(c). The remaining portion of the dummy oxide layer 744 and the dummy gate layer 745 are removed to expose the first channel area 703.

Figure 7D:
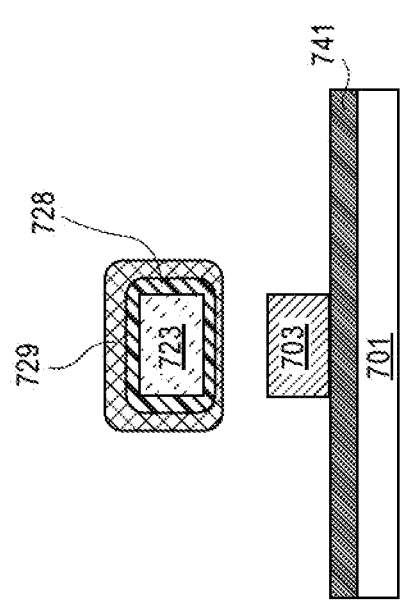

At block 607, the process 600 may include forming the first gate dielectric layer around the first channel area, and forming the first gate electrode around the first channel area, separated from the first channel area by the first gate dielectric layer; wherein a layer of a material for the first gate electrode and a layer of a material for the first gate dielectric layer are formed around the second gate electrode at a same time. More details are shown in FIG. 7(d). The first gate dielectric layer 708 is formed around the first channel area 703, and the first gate electrode 709 is formed around the first channel area 703, separated from the first channel area 703 by the first gate dielectric layer 708. A layer of a material for the first gate electrode 709 and a layer of a material for the first gate dielectric layer 708 are formed around the second gate electrode 729 at a same time.

Figure 7F:
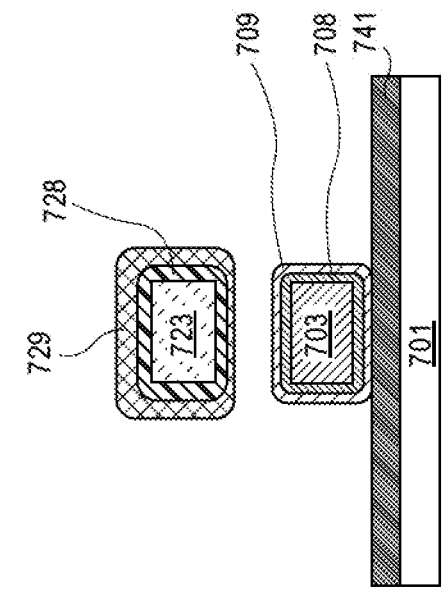
Figure 7E:
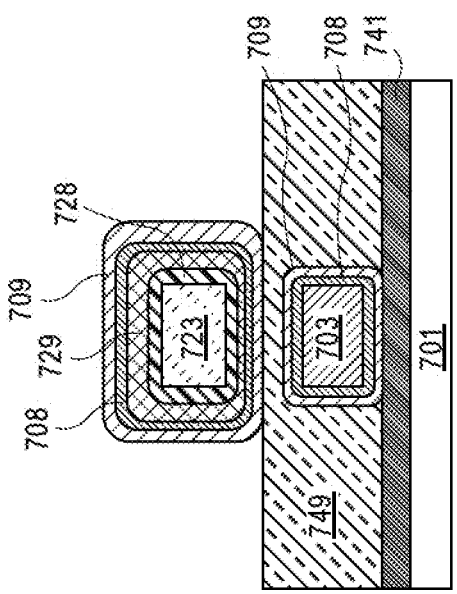

At block 609, the process 600 may include removing the layer of the material for the first gate electrode and the layer of the material for the first gate dielectric layer around the second gate electrode to expose the second gate electrode. More details are shown in FIGS. 7(e)-7(f). As shown in FIG. 7(e), a mask layer 749 is formed to cover the first gate electrode 709, and the first bonding layer 741. As shown in FIG. 7(f), the layer of the material for the first gate electrode 709 and the layer of the material for the first gate dielectric layer 708 around the second gate electrode 729 are removed to expose the second gate electrode 729. Afterwards, the mask layer 749 is removed to expose the first gate electrode 709.

Figure 7G:
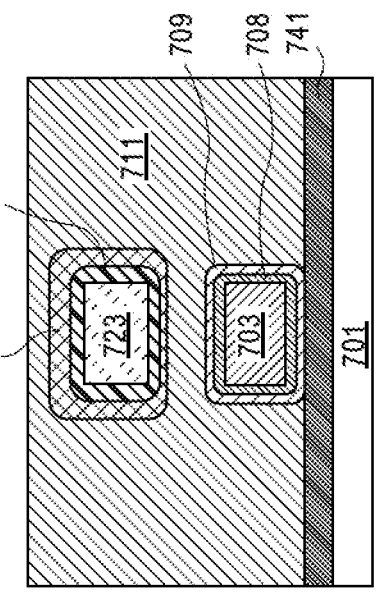

At block 611, the process 600 may include forming a metal electrode surrounding the first gate electrode and the second gate electrode. More details are shown in FIG. 7(g). A metal electrode 711 is formed to surround the first gate electrode 709 and the second gate electrode 729.

Figure 8:
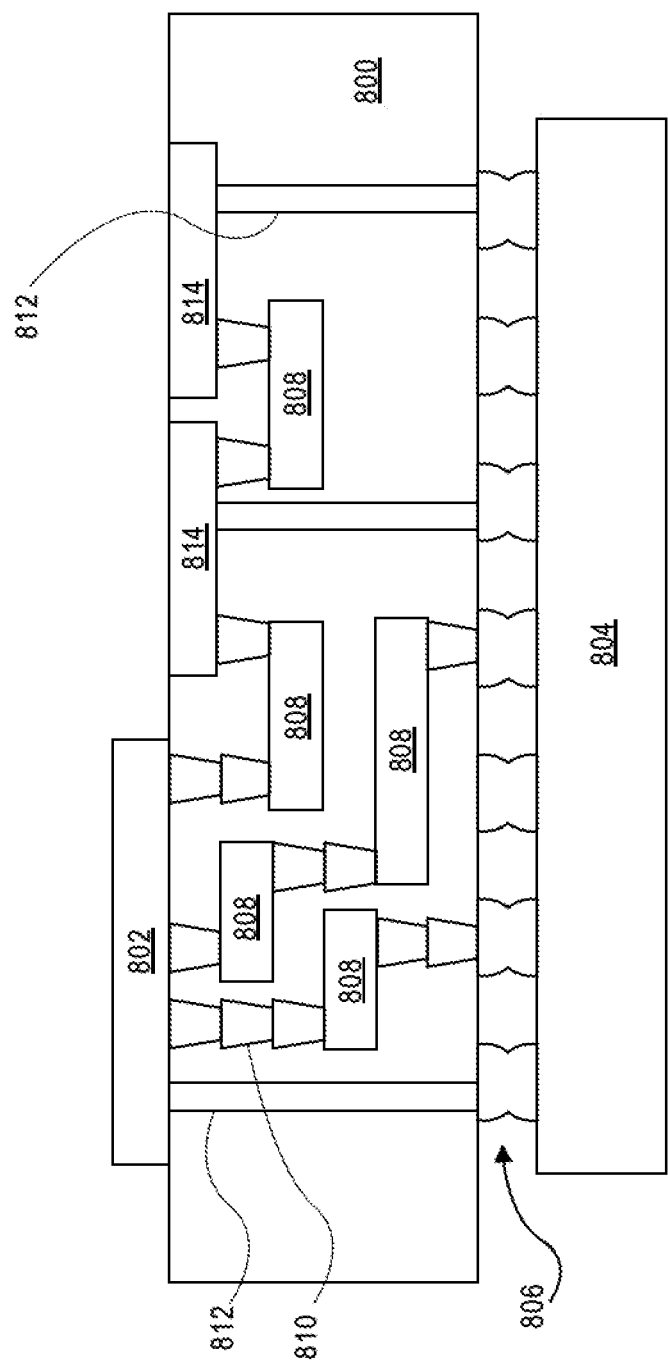
FIG. 8 schematically illustrates an interposer implementing one or more embodiments of the disclosure, in accordance with some embodiments.

FIG. 8 illustrates an interposer 800 that includes one or more embodiments of the disclosure. The interposer 800 is an intervening substrate used to bridge a first substrate 802 to a second substrate 804. The first substrate 802 may be, for instance, a substrate support for a semiconductor device, e.g., the semiconductor device 100, the semiconductor device 140, or the semiconductor device 170, as shown in FIGS. 1(a)-1(c), or a semiconductor device formed following the process 200 shown in FIG. 2, following the process 400 shown in FIG. 4, or following the process 600 shown in FIG. 6. The second substrate 804 may be, for instance, a memory module, a computer motherboard, or another integrated circuit die. Generally, the purpose of an interposer 800 is to spread a connection to a wider pitch or to reroute a connection to a different connection. For example, an interposer 800 may couple an integrated circuit die to a ball grid array (BGA) 806 that can subsequently be coupled to the second substrate 804. In some embodiments, the first and second substrates 802/804 are attached to opposing sides of the interposer 800. In other embodiments, the first and second substrates 802/804 are attached to the same side of the interposer 800. And in further embodiments, three or more substrates are interconnected by way of the interposer 800.

The interposer 800 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 808 and vias 810, including but not limited to through-silicon vias (TSVs) 812. The interposer 800 may further include embedded devices 814, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 800.

In accordance with embodiments of the disclosure, apparatuses or processes disclosed herein may be used in the fabrication of interposer 800.

Figure 9:
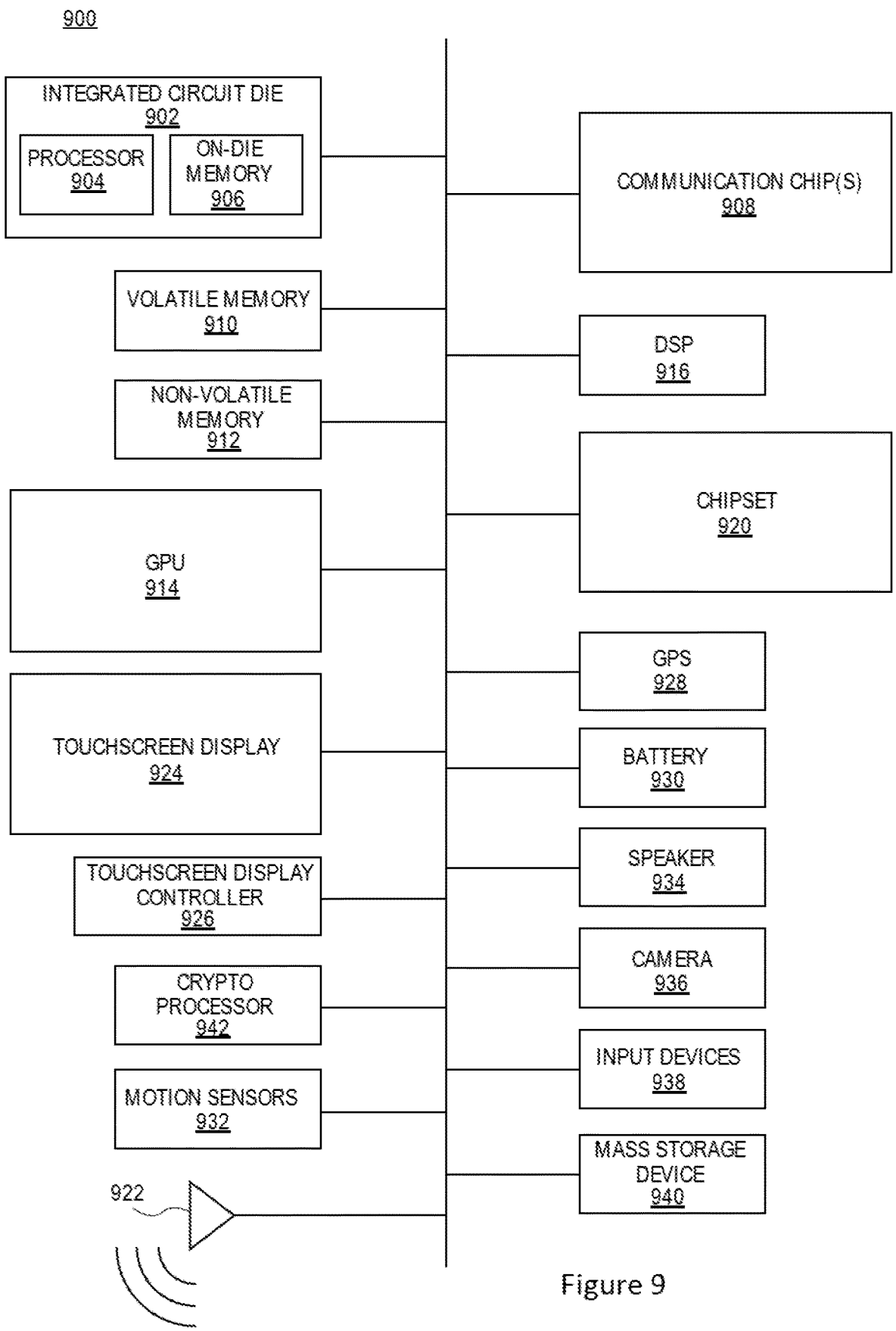
FIG. 9 schematically illustrates a computing device built in accordance with an embodiment of the disclosure, in accordance with some embodiments.

FIG. 9 illustrates a computing device 900 in accordance with one embodiment of the disclosure. The computing device 900 may include a number of components. In one embodiment, these components are attached to one or more motherboards. In an alternate embodiment, some or all of these components are fabricated onto a single system-on-a-chip (SoC) die, such as a SoC used for mobile devices. The components in the computing device 900 include, but are not limited to, an integrated circuit die 902 and at least one communications logic unit 908. In some implementations the communications logic unit 908 is fabricated within the integrated circuit die 902 while in other implementations the communications logic unit 908 is fabricated in a separate integrated circuit chip that may be bonded to a substrate or motherboard that is shared with or electronically coupled to the integrated circuit die 902. The integrated circuit die 902 may include a processor 904 as well as on-die memory 906, often used as cache memory, which can be provided by technologies such as embedded DRAM (eDRAM), or SRAM. For example, the processor 904 as well as the on-die memory 906 may include the semiconductor device 100, the semiconductor device 140, or the semiconductor device 170, as shown in FIGS. 1(a)-1(c), or a semiconductor device formed following the process 200 shown in FIG. 2, following the process 400 shown in FIG. 4, or following the process 600 shown in FIG. 6

In embodiments, the computing device 900 may include a display or a touchscreen display 924, and a touchscreen display controller 926. A display or the touchscreen display 924 may include a FPD, an AMOLED display, a TFT LCD, a micro light-emitting diode (μLED) display, or others.

Computing device 900 may include other components that may or may not be physically and electrically coupled to the motherboard or fabricated within a SoC die. These other components include, but are not limited to, volatile memory 910 (e.g., dynamic random access memory (DRAM), non-volatile memory 912 (e.g., ROM or flash memory), a graphics processing unit 914 (GPU), a digital signal processor (DSP) 916, a crypto processor 942 (e.g., a specialized processor that executes cryptographic algorithms within hardware), a chipset 920, at least one antenna 922 (in some implementations two or more antenna may be used), a battery 930 or other power source, a power amplifier (not shown), a voltage regulator (not shown), a global positioning system (GPS) device 928, a compass, a motion coprocessor or sensors 932 (that may include an accelerometer, a gyroscope, and a compass), a microphone (not shown), a speaker 934, a camera 936, user input devices 938 (such as a keyboard, mouse, stylus, and touchpad), and a mass storage device 940 (such as hard disk drive, compact disk (CD), digital versatile disk (DVD), and so forth). The computing device 900 may incorporate further transmission, telecommunication, or radio functionality not already described herein. In some implementations, the computing device 900 includes a radio that is used to communicate over a distance by modulating and radiating electromagnetic waves in air or space. In further implementations, the computing device 900 includes a transmitter and a receiver (or a transceiver) that is used to communicate over a distance by modulating and radiating electromagnetic waves in air or space.

The communications logic unit 908 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communications logic unit 908 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Infrared (IR), Near Field Communication (NFC), Bluetooth, derivatives thereof, as well as any other wireless protocols that are designated as 3G, 4G, 5G, and beyond. The computing device 900 may include a plurality of communications logic units 908. For instance, a first communications logic unit 908 may be dedicated to shorter range wireless communications such as Wi-Fi, NFC, and Bluetooth and a second communications logic unit 908 may be dedicated to longer range wireless communications such as GPS, EDGE, GPRS, CDMA, WiMAX, LTE, Ev-DO, and others.

The processor 904 of the computing device 900 includes one or more devices, such as transistors. The term "processor" may refer to any device or portion of a device that processes electronic data from registers and/or memory to transform that electronic data into other electronic data that may be stored in registers and/or memory. The communications logic unit 908 may also include one or more devices, such as transistors.

In further embodiments, another component housed within the computing device 900 may contain one or more devices, such as DRAM, that are formed in accordance with implementations of the current disclosure, e.g., the semiconductor device 100, the semiconductor device 140, or the semiconductor device 170, as shown in FIGS. 1(a)-1(c), or a semiconductor device formed following the process 200 shown in FIG. 2, following the process 400 shown in FIG. 4, or following the process 600 shown in FIG. 6.

In various embodiments, the computing device 900 may be a laptop computer, a netbook computer, a notebook computer, an ultrabook computer, a smartphone, a dumbphone, a tablet, a tablet/laptop hybrid, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 900 may be any other electronic device that processes data.

Some Non-Limiting Examples are Provided Below.

Example 1 may include a semiconductor device, comprising: a first transistor stacked above a second transistor, wherein the first transistor and the second transistor are self-aligned that a shadow of the first transistor substantially overlaps with the second transistor; the first transistor includes: a first gate electrode; a first channel layer including a first channel material, separated from the first gate electrode by a first gate dielectric layer; and a first source electrode coupled to the first channel layer; and the second transistor includes: a second gate electrode; a second channel layer including a second channel material, separated from the second gate electrode by a second gate dielectric layer; and a second source electrode coupled to the second channel layer, self-aligned with the first source electrode, and separated from the first source electrode by an isolation layer.

Example 2 may include the semiconductor device of example 1 and/or some other examples herein, wherein the first transistor is an NMOS transistor, and the second transistor is a PMOS transistor.

Example 3 may include the semiconductor device of example 1 and/or some other examples herein, wherein the first gate electrode of the first transistor and the second gate electrode of the second transistor are self-aligned.

Example 4 may include the semiconductor device of example 1 and/or some other examples herein, wherein the first gate electrode is directly coupled to the second gate electrode without any additional conductive contact.

Example 5 may include the semiconductor device of example 1 and/or some other examples herein, wherein the first gate electrode includes a first conductive material, and the second gate electrode includes a second conductive material different from the first conductive material.

Example 6 may include the semiconductor device of example 1 and/or some other examples herein, wherein the first gate electrode and the second gate electrode are surrounded by one metal electrode.

Example 7 may include the semiconductor device of example 1 and/or some other examples herein, wherein the first gate electrode, the first source electrode, the second gate electrode, or the second source electrode includes a material selected from the group consisting of titanium (Ti), molybdenum (Mo), gold (Au), platinum (Pt), aluminum (Al), nickel (Ni), copper (Cu), chromium (Cr), hafnium (Hf), indium (In), and an alloy of Ti, Mo, Au, Pt, Al, Ni, Cu, Cr, TiAlN, HfAlN, TiN, Co, Ru, W, silicide, or InAlO.

Example 8 may include the semiconductor device of example 1 and/or some other examples herein, wherein the first channel material is different from the second channel material.

Example 9 may include the semiconductor device of example 1 and/or some other examples herein, wherein the first channel material or the second channel material includes silicon (Si), germanium(Ge), silicon-germanium (SiGe), gallium arsenide(GaAs), a III-V material, an III-N material, indium gallium arsenide(InGaAs), indium phosphide(InP), a 2-D material, an oxide semiconductor material, or gallium nitride(GaN).

Example 10 may include the semiconductor device of example 1 and/or some other examples herein, wherein the first channel layer includes one or more fins, one or more nanowires, or one or more nanoribbons, and the second channel layer includes one or more fins, one or more nanowires, or one or more nanoribbons.

Example 11 may include the semiconductor device of example 10 and/or some other examples herein, wherein the first channel layer includes a first channel area, the second channel layer includes a second channel area with a shape different from a shape of the first channel area.

Example 12 may include the semiconductor device of example 1 and/or some other examples herein, wherein the first gate dielectric layer includes a first gate dielectric material, the second gate dielectric layer includes a second gate dielectric material different from the first gate dielectric material.

Example 13 may include the semiconductor device of example 12 and/or some other examples herein, wherein first gate dielectric layer or the second gate dielectric layer includes a high-k dielectric material selected from the group consisting of hafnium silicate, zirconium silicate, hafnium dioxide, zirconium dioxide, aluminum oxide, HfAlOx, lanthanum silicate, yttrium oxide, and nitride hafnium silicate.

Example 14 may include the semiconductor device of example 1 and/or some other examples herein, wherein the first transistor is located at a front side of a wafer, and the second transistor is located at a backside of the wafer.

Example 15 may include the semiconductor device of example 1 and/or some other examples herein, further comprising: an isolation layer between the first gate electrode of the first transistor and the second gate electrode of the second transistor.

Example 16 may include the semiconductor device of example 1 and/or some other examples herein, further comprising: a semiconductor substrate; and a bonding layer above the semiconductor substrate and below and adjacent to the second transistor.

Example 17 may include the semiconductor device of example 16 and/or some other examples herein, wherein the semiconductor substrate includes an III-V substrate, a silicon substrate, a bulk substrate, or a glass substrate.

Example 18 may include a method for forming a semiconductor device, the method comprising: forming a channel stack above a carrier wafer, wherein the carrier wafer includes a substrate and a first bonding layer above the substrate, the channel stack includes a first channel layer, a second bonding layer above the first channel layer, and a second channel layer above the second bonding layer, the first channel layer includes a first channel material, and the second channel layer includes a second channel material; patterning the channel stack simultaneously by a set of front end mask to form a first channel area of the first channel layer, and a second channel area of the second channel layer separated from the first channel area by the second bonding layer; forming a dummy oxide layer and a dummy gate layer covering the first channel area and the second channel area; forming a first source electrode next to the first channel area, and forming a second source electrode next to the second channel area, wherein the second source electrode is self-aligned with the first source electrode, and separated from the first source electrode by an isolation layer; forming a first drain electrode next to the first channel area, and forming a second drain electrode next to the second channel area, wherein the second drain electrode is self-aligned with the first drain electrode, and separated from the first drain electrode by an isolation layer; forming a first gate dielectric layer around the first channel area, and a second gate dielectric layer around the second channel area; and forming a first gate electrode around the first channel area, separated from the first channel area by the first gate dielectric layer, and forming a second gate electrode around the second channel area, separated from the second channel area by the second gate dielectric layer.

Example 19 may include the method of example 18 and/or some other examples herein, wherein the forming a channel stack above a carrier wafer including forming the channel stack by a wafer bonding process or epitaxial grown over the carrier wafer.

Example 20 may include the method of example 18 and/or some other examples herein, further comprising: forming a first contact coupled to the first gate electrode, the first source electrode, or the first drain electrode, or forming a second contact coupled to the second gate electrode, the second source electrode, or the second drain electrode, wherein the first contact is within an interconnect at a backside of the substrate, and the second contact is within an interconnect at a front side of the substrate.

Example 21 may include the method of example 18 and/or some other examples herein, further comprising: partially removing the dummy oxide layer and the dummy gate layer to cover the first channel area only to release the second channel area; forming the second gate dielectric layer around the second channel area, and forming the second gate electrode around the second channel area, separated from the second channel area by the second gate dielectric layer; removing the first bonding layer and the substrate to expose the first channel area; and forming the first gate dielectric layer around the first channel area, and forming the first gate electrode around the first channel area, separated from the first channel area by the first gate dielectric layer, wherein the first gate electrode is directly coupled to the second gate electrode without any additional conductive contact.

Example 22 may include the method of example 18 and/or some other examples herein, further comprising: partially removing the dummy oxide layer and the dummy gate layer to have a remaining portion covering the first channel area only to release the second channel area; forming the second gate dielectric layer around the second channel area, and forming the second gate electrode around the second channel area, separated from the second channel area by the second gate dielectric layer; removing the remaining portion of the dummy oxide layer and the dummy gate layer to expose the first channel area; forming the first gate dielectric layer around the first channel area, and forming the first gate electrode around the first channel area, separated from the first channel area by the first gate dielectric layer; wherein a layer of a material for the first gate electrode and a layer of a material for the first gate dielectric layer are formed around the second gate electrode at a same time; removing the layer of the material for the first gate electrode and the layer of the material for the first gate dielectric layer around the second gate electrode to expose the second gate electrode; and forming a metal electrode surrounding the first gate electrode and the second gate electrode.

Example 23 may include a computing device, comprising: a circuit board; and a processor or a memory device coupled to the circuit board, wherein the processor or the memory device includes an integrated circuit (IC), wherein the IC includes: a first transistor stacked above a second transistor, wherein the first transistor and the second transistor are self-aligned that a shadow of the first transistor substantially overlaps with the second transistor; the first transistor includes: a first gate electrode; a first channel layer including a first channel material, separated from the first gate electrode by a first gate dielectric layer; and a first source electrode coupled to the first channel layer; and the second transistor includes: a second gate electrode; a second channel layer including a second channel material, separated from the second gate electrode by a second gate dielectric layer; and a second source electrode coupled to the second channel layer, self-aligned with the first source electrode, and separated from the first source electrode by an isolation layer.

Example 24 may include computing device of example 23 and/or some other examples herein, wherein the first transistor is an NMOS transistor, and the second transistor is a PMOS transistor; the first gate electrode of the first transistor and the second gate electrode of the second transistor are self-aligned; the first gate electrode is directly coupled to the second gate electrode without any additional conductive contact; and the first gate electrode includes a first conductive material, and the second gate electrode includes a second conductive material different from the first conductive material.

Example 25 may include computing device of example 23 and/or some other examples herein, wherein the computing device is a device selected from the group consisting of a wearable device or a mobile computing device, the wearable device or the mobile computing device including one or more of an antenna, a touchscreen controller, a display, a battery, a processor, an audio codec, a video codec, a power amplifier, a global positioning system (GPS) device, a compass, a Geiger counter, an accelerometer, a gyroscope, a speaker, and a camera coupled with the memory device.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. A semiconductor device, comprising:
   a first transistor stacked above a second transistor, wherein the first transistor and the second transistor are self-aligned that a shadow of the first transistor substantially overlaps with the second transistor;
   the first transistor includes:
      a first gate electrode;
      a first channel layer including a first channel material, separated from the first gate electrode by a first gate dielectric layer, wherein a first portion of the first gate electrode is above the first channel layer, and a second portion of the first gate electrode is below the first channel layer; and
      a first source electrode coupled to the first channel layer; and
   the second transistor includes:
      a second gate electrode;
      a second channel layer including a second channel material, separated from the second gate electrode by a second gate dielectric layer, wherein a first portion of the second gate electrode is above the second channel layer, and a second portion of the second gate electrode is below the second channel layer; and
      a second source electrode coupled to the second channel layer, self-aligned with the first source electrode, and separated from the first source electrode by an isolation layer.

2. The semiconductor device of claim 1, wherein the first transistor is an NMOS transistor, and the second transistor is a PMOS transistor.

3. The semiconductor device of claim 1, wherein the first gate electrode of the first transistor and the second gate electrode of the second transistor are self-aligned.

4. The semiconductor device of claim 1, wherein the first gate electrode is directly coupled to the second gate electrode without any additional conductive contact.

5. The semiconductor device of claim 1, wherein the first gate electrode includes a first conductive material, and the second gate electrode includes a second conductive material different from the first conductive material.

6. The semiconductor device of claim 1, wherein the first gate electrode and the second gate electrode are surrounded by one metal electrode.

7. The semiconductor device of claim 1, wherein the first gate electrode, the first source electrode, the second gate electrode, or the second source electrode includes a material selected from the group consisting of titanium (Ti), molybdenum (Mo), gold (Au), platinum (Pt), aluminum (Al), nickel (Ni), copper (Cu), chromium (Cr), hafnium (Hf), indium (In), and an alloy of Ti, Mo, Au, Pt, Al, Ni, Cu, Cr, TiAlN, HfAlN, TiN, Co, Ru, W, silicide, or InAlO.

8. The semiconductor device of claim 1, wherein the first channel material is different from the second channel material.

9. The semiconductor device of claim 1, wherein the first channel material or the second channel material includes silicon (Si), germanium(Ge), silicon-germanium(SiGe), gallium arsenide(GaAs), a III-V material, an III-N material, indium gallium arsenide(InGaAs), indium phosphide(InP), a 2-D material, an oxide semiconductor material, or gallium nitride(GaN).

10. The semiconductor device of claim 1, wherein the first channel layer includes one or more fins, one or more nanowires, or one or more nanoribbons, and the second channel layer includes one or more fins, one or more nanowires, or one or more nanoribbons.

11. The semiconductor device of claim 10, wherein the first channel layer includes a first channel area, the second channel layer includes a second channel area with a shape different from a shape of the first channel area.

12. The semiconductor device of claim 1, wherein the first gate dielectric layer includes a first gate dielectric material, the second gate dielectric layer includes a second gate dielectric material different from the first gate dielectric material.

13. The semiconductor device of claim 12, wherein first gate dielectric layer or the second gate dielectric layer includes a high-k dielectric material selected from the group consisting of hafnium silicate, zirconium silicate, hafnium dioxide, zirconium dioxide, aluminum oxide, HfAlOx, lanthanum silicate, yttrium oxide, and nitride hafnium silicate.

14. The semiconductor device of claim 1, wherein the first transistor is located at a front side of a wafer, and the second transistor is located at a backside of the wafer.

15. The semiconductor device of claim 1, further comprising:
an isolation layer between the first gate electrode of the first transistor and the second gate electrode of the second transistor.

16. The semiconductor device of claim 1, further comprising:
a semiconductor substrate; and
a bonding layer above the semiconductor substrate and below and adjacent to the second transistor.

17. The semiconductor device of claim 16, wherein the semiconductor substrate includes an III-V substrate, a silicon substrate, a bulk substrate, or a glass substrate.

18. A computing device, comprising:
a circuit board; and
a processor or a memory device coupled to the circuit board, wherein the processor or the memory device includes an integrated circuit (IC), wherein the IC includes:
a first transistor stacked above a second transistor, wherein the first transistor and the second transistor are self-aligned that a shadow of the first transistor substantially overlaps with the second transistor;
the first transistor includes:
a first gate electrode;
a first channel layer including a first channel material, separated from the first gate electrode by a first gate dielectric layer, wherein a first portion of the first gate electrode is above the first channel layer, and a second portion of the first gate electrode is below the first channel layer; and
a first source electrode coupled to the first channel layer; and
the second transistor includes:
a second gate electrode;
a second channel layer including a second channel material, separated from the second gate electrode by a second gate dielectric layer, wherein a first portion of the second gate electrode is above the second channel layer, and a second portion of the second gate electrode is below the second channel layer; and
a second source electrode coupled to the second channel layer, self-aligned with the first source electrode, and separated from the first source electrode by an isolation layer.

19. The computing device of claim 18, wherein the first transistor is an NMOS transistor, and the second transistor is a PMOS transistor;
the first gate electrode of the first transistor and the second gate electrode of the second transistor are self-aligned;
the first gate electrode is directly coupled to the second gate electrode without any additional conductive contact; and
the first gate electrode includes a first conductive material, and the second gate electrode includes a second conductive material different from the first conductive material.

20. The computing device of claim 18, wherein the computing device is a device selected from the group consisting of a wearable device or a mobile computing device, the wearable device or the mobile computing device including one or more of an antenna, a touchscreen controller, a display, a battery, a processor, an audio codec, a video codec, a power amplifier, a global positioning system (GPS) device, a compass, a Geiger counter, an accelerometer, a gyroscope, a speaker, and a camera coupled with the memory device.

* * * * *